United States Patent
Kim et al.

(10) Patent No.: US 11,735,532 B2
(45) Date of Patent: Aug. 22, 2023

(54) SEMICONDUCTOR PACKAGES

(71) Applicant: Samsung Electronics Co., Ltd., Suwon-si (KR)

(72) Inventors: Joonsung Kim, Suwon-si (KR); Doohwan Lee, Cheonan-si (KR); Taeho Ko, Cheonan-si (KR); Bongsoo Kim, Sejong-si (KR); Seokbong Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/664,132

(22) Filed: May 19, 2022

(65) Prior Publication Data
US 2022/0278049 A1 Sep. 1, 2022

Related U.S. Application Data

(63) Continuation of application No. 17/007,945, filed on Aug. 31, 2020, now Pat. No. 11,355,445.

(30) Foreign Application Priority Data

Dec. 26, 2019 (KR) ........................ 10-2019-0175483

(51) Int. Cl.
*H01L 23/538* (2006.01)
*H01L 23/31* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 23/5389; H01L 21/4853; H01L 21/4857; H01L 21/565; H01L 21/568;
(Continued)

(56) References Cited

U.S. PATENT DOCUMENTS

| | | | | |
|---|---|---|---|---|
| 6,114,005 A | * | 9/2000 | Nagai ..................... | B32B 27/12 |
| | | | | 174/148 |
| 7,791,204 B2 | * | 9/2010 | Hayashi .............. | H01L 21/6835 |
| | | | | 257/773 |

(Continued)

FOREIGN PATENT DOCUMENTS

| | | |
|---|---|---|
| JP | 5369827 B2 | 9/2013 |
| KR | 101952598 B1 | 2/2019 |

*Primary Examiner* — Vu A Vu
(74) *Attorney, Agent, or Firm* — Myers Bigel, P.A.

(57) ABSTRACT

A semiconductor package includes a lower connection structure, a semiconductor chip on the lower connection structure, an upper connection structure including a first conductive pattern layer on the semiconductor chip, a first insulating layer on the first conductive pattern layer, a second conductive pattern layer on the first insulating layer, a first via penetrating the first insulating layer to extend between the first conductive pattern layer and the second conductive pattern layer, and a second insulating layer extending between a side surface of the first via and the first insulating layer, and an intermediate connection structure between the lower connection structure and the upper connection structure. A chemical composition of the first insulating layer may differ from a chemical composition of the second insulating layer.

14 Claims, 15 Drawing Sheets

(51) Int. Cl.
*H01L 23/66* (2006.01)
*H01L 23/00* (2006.01)
*H01L 25/065* (2023.01)
*H01L 25/10* (2006.01)
*H01L 21/683* (2006.01)
*H01L 21/48* (2006.01)
*H01L 21/56* (2006.01)
*H01P 3/08* (2006.01)
*H01P 11/00* (2006.01)
*H01L 23/29* (2006.01)

(52) U.S. Cl.
CPC .......... *H01L 21/565* (2013.01); *H01L 21/568* (2013.01); *H01L 21/6835* (2013.01); *H01L 23/295* (2013.01); *H01L 23/3128* (2013.01); *H01L 23/5383* (2013.01); *H01L 23/5386* (2013.01); *H01L 23/66* (2013.01); *H01L 24/19* (2013.01); *H01L 24/20* (2013.01); *H01L 25/0657* (2013.01); *H01L 25/105* (2013.01); *H01P 3/081* (2013.01); *H01P 11/003* (2013.01); *H01L 2221/68372* (2013.01); *H01L 2223/6627* (2013.01); *H01L 2224/214* (2013.01); *H01L 2225/0651* (2013.01); *H01L 2225/06568* (2013.01); *H01L 2225/06586* (2013.01); *H01L 2225/1035* (2013.01); *H01L 2225/1058* (2013.01); *H01L 2924/19032* (2013.01); *H01L 2924/19041* (2013.01); *H01L 2924/19103* (2013.01)

(58) Field of Classification Search
CPC ............... H01L 21/6835; H01L 23/295; H01L 23/3128; H01L 23/5383; H01L 23/5386; H01L 23/66; H01L 24/19; H01L 24/20; H01L 25/0657; H01L 25/105; H01L 2221/68372; H01L 2223/6627; H01L 2224/214; H01L 2225/0651; H01L 2225/06568; H01L 2225/06586; H01L 2225/1035; H01L 2225/1058; H01L 2924/19032; H01L 2924/19041; H01L 2924/19103; H01L 23/49894; H01L 23/15; H01L 23/49816; H01L 23/49822; H01L 23/50; H01L 23/5384; H01L 23/5385; H01L 23/13; H01L 24/32; H01L 24/48; H01L 24/73; H01L 2221/68345; H01L 2224/04105; H01L 2224/12105; H01L 2224/32145; H01L 2224/48227; H01L 2224/48235; H01L 2225/1041; H01L 2924/15311; H01L 23/485; H01L 23/49827; H01L 23/528; H01P 3/081; H01P 11/003
USPC ........................................................ 257/664
See application file for complete search history.

(56) References Cited

U.S. PATENT DOCUMENTS

| | | | | |
|---|---|---|---|---|
| 7,858,441 | B2* | 12/2010 | Lin | H01L 23/5389 |
| | | | | 438/455 |
| 7,952,185 | B2 | 5/2011 | Theuss et al. | |
| 8,563,397 | B2* | 10/2013 | Chida | H01L 24/11 |
| | | | | 438/455 |
| 9,401,350 | B1 | 7/2016 | We et al. | |
| 9,966,333 | B2 | 5/2018 | Tsai et al. | |
| 10,410,961 | B2 | 9/2019 | Lee et al. | |
| 10,438,934 | B1* | 10/2019 | Lin | H01L 21/568 |
| 11,062,997 | B2* | 7/2021 | Jeng | H01L 23/5389 |
| 11,355,445 | B2* | 6/2022 | Kim | H01L 25/105 |
| 2015/0342046 | A1 | 11/2015 | Kim et al. | |
| 2016/0086885 | A1 | 3/2016 | Inagaki et al. | |
| 2017/0338196 | A1 | 11/2017 | Chiu et al. | |
| 2019/0131224 | A1 | 5/2019 | Choi et al. | |
| 2019/0139853 | A1 | 5/2019 | Oh et al. | |
| 2019/0157208 | A1 | 5/2019 | Lin et al. | |
| 2020/0098693 | A1* | 3/2020 | Jeng | H01L 21/76885 |
| 2020/0161204 | A1 | 5/2020 | Kim et al. | |

* cited by examiner

SEMICONDUCTOR PACKAGES

CROSS-REFERENCE TO RELATED APPLICATION

This application is a continuation of U.S. patent application Ser. No. 17/007,945, filed Aug. 31, 2020, which claims the benefit of Korean Patent Application No. 10-2019-0175483, filed Dec. 26, 2019, in the Korean Intellectual Property Office, the disclosure of which is incorporated herein in its entirety by reference.

BACKGROUND

One or more embodiments of the present disclosure relate to semiconductor packages. More specifically, one or more embodiments of the present disclosure relate to fan-out semiconductor packages.

In order to improve performance of a semiconductor package, the number of external connection terminals of the semiconductor package may be increased. Increasing the number of external connection terminals may involve securing an adequate planar area of the semiconductor package. On the other hand, reducing the planar area of a semiconductor chip may be used to lower manufacturing costs. There has been developed a fan-out package connecting a semiconductor chip to external connection terminals by using a connection structure having a planar area larger than that of the semiconductor chip to package the semiconductor chip having a reduced size while securing an adequate planar area of the semiconductor package for an increased number of external connection terminals.

SUMMARY

One or more embodiments of the present disclosure provide high-performance semiconductor package having a small planar area.

According to an aspect of the present disclosure, a semiconductor package includes: a lower connection structure; a semiconductor chip on the lower connection structure; an upper connection structure including a first conductive pattern layer on the semiconductor chip; a first insulating layer on the first conductive pattern layer; a second conductive pattern layer on the first insulating layer; a first via penetrating the first insulating layer to extend between the first conductive pattern layer and the second conductive pattern layer, and a second insulating layer extending between the side surface of the first via and the first insulating layer; and an intermediate connection structure between the lower connection structure and the upper connection structure. A chemical composition of the first insulating layer may differ from a chemical composition of the second insulating layer.

According to another aspect of the present disclosure, a semiconductor package includes: a lower semiconductor package; an upper semiconductor package on the lower semiconductor package; and an inter-package connection member between the lower semiconductor package and the upper semiconductor package. The lower semiconductor package includes: a first connection structure; a first semiconductor chip on the first connection structure; a second connection structure on the first connection structure; and a third connection structure including a first conductive pattern layer on the first semiconductor chip, a first insulating layer on the first conductive pattern layer and the second connection structure, a second conductive pattern layer on the first insulating layer, a first via penetrating the first insulating layer, and a second insulating layer extending between a side surface of the first via and the first insulating layer. A chemical composition of the first insulating layer m differs from a chemical composition of the second insulating layer, the upper semiconductor package includes a fourth connection structure and a second semiconductor chip on the fourth connection structure, and the inter-package connection member is between the second conductive pattern layer of the third connection structure and the fourth connection structure.

According to another aspect of the present disclosure, a semiconductor package includes: a semiconductor chip, an intermediate connection structure including an intermediate insulating layer on sides of the semiconductor chip and an intermediate via penetrating the intermediate insulating layer; a lower connection structure including a lower insulating layer on a lower surface of the semiconductor chip and on a lower surface of the intermediate connection structure and a lower conductive pattern layer on the lower insulating layer and connected to the semiconductor chip and the intermediate via; a sealing layer on the upper surface of the semiconductor chip and an upper surface of the intermediate connection structure; an upper connection structure including a first upper conductive pattern layer on the sealing layer, a first upper insulating layer on the first upper conductive pattern layer, a second upper insulating layer on the first upper insulating layer, a second upper conductive pattern layer on the second upper insulating layer, a first upper via penetrating the first upper insulating layer and the second upper insulating layer to connect between the second upper conductive pattern layer and the first upper conductive pattern layer and a second upper via penetrating the sealing layer, the first upper insulating layer, and the second upper insulating layer to connect between the second upper conductive pattern layer and the intermediate via; and an external connection terminal on a lower surface of the lower connection structure and connected to the lower conductive pattern layer. The first upper insulating layer includes a composite material including a matrix and a filler in the matrix, and the second upper insulating layer is free of the filler.

BRIEF DESCRIPTION OF THE DRAWINGS

Embodiments of the present disclosure will be more clearly understood from the following detailed description taken in conjunction with the accompanying drawings in which.

DETAILED DESCRIPTION

Figure 1:
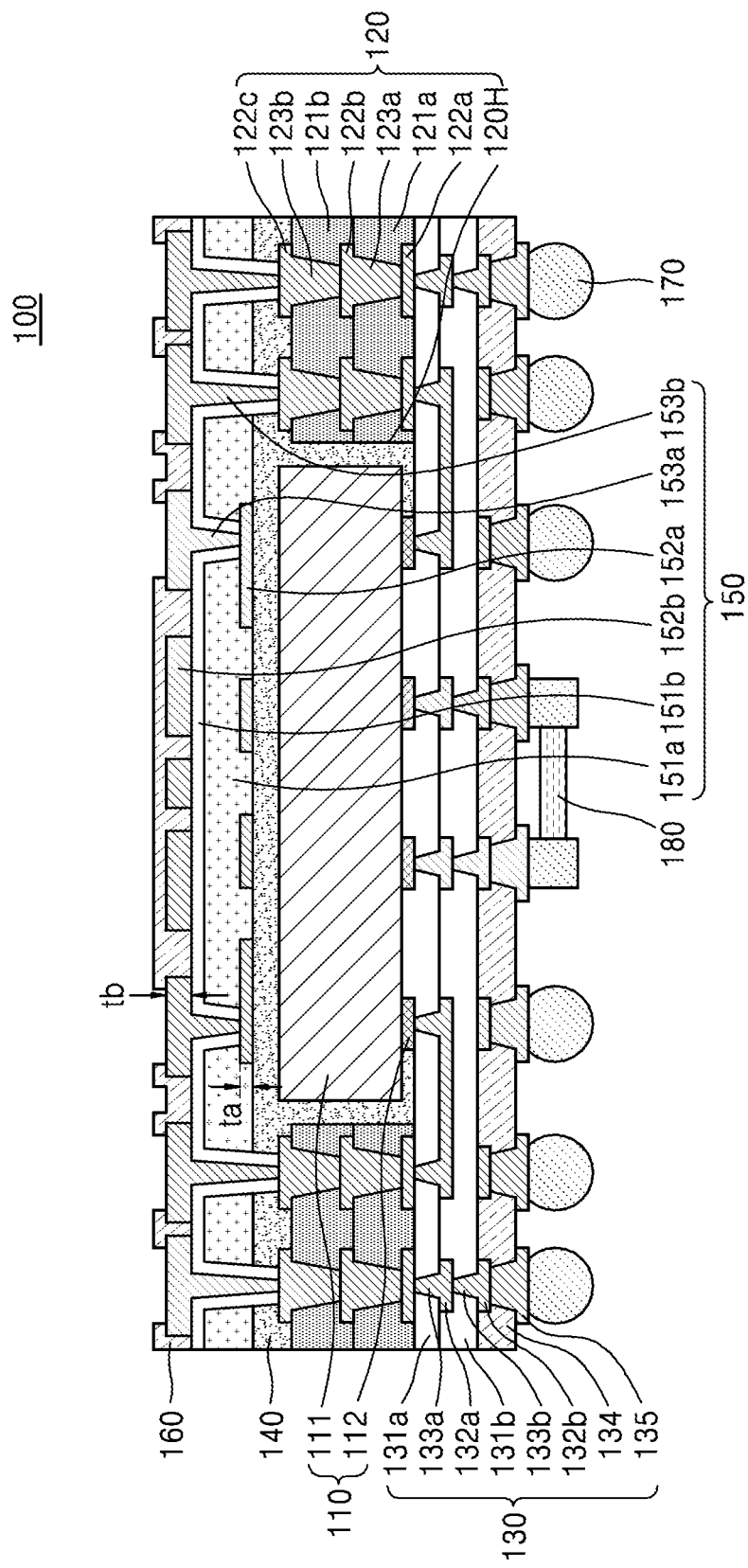
FIG. 1 is a cross-sectional view illustrating a semiconductor package according to an embodiment of the present disclosure.

A lower connection structure 130, an intermediate connection structure 120, and an upper connection structure 150 to be described herein with reference to FIG. 1 may be referred to as a connection structure. In addition, first and second lower insulating layers 131a and 131b, first and second intermediate insulating layers 121a and 121b, and first and second upper insulating layers 151a and 151b may be referred to as an insulating layer. Moreover, first and second lower conductive pattern layers 132a and 132b, first, second, and third intermediate conductive pattern layers 122a, 122b, and 122c, and first and second upper conductive pattern layers 152a and 152b to be described herein with reference to FIG. 1 may be referred to as a conductive pattern layer. Furthermore, first and second lower vias 133a and 133b, first and second intermediate vias 123a and 123b, and first and second upper vias 153a and 153b to be described herein with reference to FIG. 1 may be referred to as a via.

FIG. 1 is a cross-sectional view illustrating a semiconductor package 100 according to an embodiment of the present disclosure.

Referring to FIG. 1, the semiconductor package 100 may include: the lower connection structure 130; a first semiconductor chip 110 on an upper surface of the lower connection structure 130; the intermediate connection structure 120 on an upper surface of the lower connection structure 130; and the upper connection structure 150 on the first semiconductor chip 110 and the intermediate connection structure 120. In some embodiments, the semiconductor package 100 may further include a first sealing layer 140 between the intermediate connection structure 120 and the upper connection structure 150. In some embodiments, the semiconductor package 100 may further include an upper protective layer 160 on the upper connection structure 150. In some embodiments, the semiconductor package 100 may further include an external connection terminal 170 on a lower surface of the lower connection structure 130. In some embodiments, the semiconductor package 100 may further include a capacitor 180 on a lower surface of the lower connection structure 130.

The lower connection structure 130 may be configured to connect between the first semiconductor chip 110 and the external connection terminal 170, between the intermediate connection structure 120 and the first semiconductor chip 110, and between the intermediate connection structure 120 and the external connection terminal 170. The lower connection structure 130 may include: at least one lower insulating layer 131a and 131b; at least one lower conductive pattern layer 132a and 132b on the at least one lower insulating layer 131a and 131b; and at least one lower via 133a and 133b penetrating the at least one lower insulating layer 131a and 131b to be in contact with the at least one lower conductive pattern layer 132a and 132b. The at least one lower conductive pattern layer 132a and 132b, and the at least one lower via 133a and 133b may provide electrical paths connecting between the first semiconductor chip 110 and the external connection terminal 170, between the intermediate connection structure 120 and the first semiconductor chip 110, and between the intermediate connection structure 120 and the external connection terminal 170. In some embodiments, the lower connection structure 130 may further include a lower protective layer 134 and a lower pad 135 on the lower protective layer 134. The lower connection structure 130 may include a redistribution structure or a printed circuit board (PCB).

For example, the lower connection structure 130 may include: the first lower insulating layer 131a on a lower surface of the first semiconductor chip 110 and on a lower surface of the intermediate connection structure 120; the first lower conductive pattern layer 132a on a lower surface of the first lower insulating layer 131a; the first lower via 133a penetrating the first lower insulating layer 131a to be in contact with the first lower conductive pattern layer 132a; the second lower insulating layer 131b on a lower surface of the first lower insulating layer 131a and on a lower surface of the first lower conductive pattern layer 132a; the second lower conductive pattern layer 132b on a lower surface of the second lower insulating layer 131b; and the second lower via 133b penetrating the second lower insulating layer 131b to extend between the first lower conductive pattern layer 132a and the second lower conductive pattern layer 132b. In some embodiments, unlike the illustration in FIG. 1, the lower connection structure 130 may include more or fewer than two lower conductive pattern layers. The first lower conductive pattern layer 132a may be connected to the first intermediate conductive pattern layer 122a of the intermediate connection structure 120 and a chip pad 112 of the first semiconductor chip 110 through the first lower via 133a, and the second lower conductive pattern layer 132b may be connected to the first lower conductive pattern layer 132a through the second lower via 133b.

The first and second lower insulating layers 131a and 131b may include, for example, an inorganic insulating material, an organic insulating material, or a combination thereof. The inorganic insulating material may include, for example, silicon oxide, silicon nitride, or a combination thereof. The organic insulating material may include, for example, polyimide, epoxy resin, or a combination thereof. The first and second lower conductive pattern layers 132a and 132b and the first and second lower vias 133a and 133b may include, for example, a conductive material such as copper (Cu), gold (Au), silver (Ag), nickel (Ni), tungsten (W), aluminum (Al), or an alloy thereof. In some embodiments, the first and second lower conductive pattern layers 132a and 132b and the first and second lower vias 133a and 133b may further include a barrier material to prevent the conductive material from diffusing out of the first and second lower conductive pattern layers 132a and 132b and the first and second lower vias 133a and 133b. The barrier material may include, for example, titanium (Ti), tantalum (Ta), titanium nitride (TiN), tantalum nitride (TaN), or a combination thereof.

The lower protective layer 134 may be positioned on a lower surface of the second lower insulating layer 131b. The lower protective layer 134 may physically and/or chemically protect the lower connection structure 130 from the environment. In some embodiments, the lower protective layer 134 may include a composite material. In other words, the lower protective layer 134 may include a matrix and a filler in the matrix. The matrix may include polymer, and the filler may include silica, titania, or a combination thereof.

The lower pad 135 may be disposed on a lower surface of the lower protective layer 134 and penetrate the lower protective layer 134 to be in contact with the second lower conductive pattern layer 132b, thus connecting between the second lower conductive pattern layer 132b and the external connection terminal 170. The lower pad 135 may include, for example, a conductive material such as Cu, Au, Ag, Ni, W, Al, or an alloy thereof. In some embodiments, the lower pad 135 may further include a barrier material to prevent the conductive material from diffusing out of the lower pad 135. The barrier material may include, for example, Ti, Ta, TiN, TaN, or a combination thereof. In some embodiments, the lower pad 135 may further include a wetting material to increase wettability between the conductive material and the external connection terminal 170. When the conductive material includes Cu, the wetting material may include Ni, Au, or an alloy thereof.

The first semiconductor chip 110 may include a body 111 and the chip pad 112 on a lower surface of the body 111. The body 111 may include a substrate and an integrated circuit on the substrate. A surface of the first semiconductor chip 110 on which the integrated circuit is formed may be referred to as an active surface, and a surface of the first semiconductor chip 110 opposite the active surface may be referred to as an inactive surface. In FIG. 1, the active surface of the first semiconductor chip 110 may be a lower surface of the first semiconductor chip 110, and the inactive surface of the first semiconductor chip 110 may be an upper surface of the first semiconductor chip 110. The substrate may include a semiconductor material, such as a Group IV semiconductor material, a Group III-V semiconductor material, a Group II-VI semiconductor material, or a combination thereof. The Group IV semiconductor material may include, for example, silicon (Si), germanium (Ge), or a combination thereof. The Group III-V semiconductor material may include, for example, gallium arsenide (GaAs), indium phosphide (InP), indium arsenide (InAs), indium antimonide (InSb), indium gallium arsenide (InGaAs), or a combination thereof. The Group II-VI semiconductor material may include, for example, zinc telluride (ZnTe), cadmium sulfide (CdS), or a combination thereof. The integrated circuit may include any type of integrated circuit, such as, for example, a memory circuit, a logic circuit, or a combination thereof. The memory circuit may include, for example, a dynamic random access memory (DRAM) circuit, a static random access memory (SRAM) circuit, a flash memory circuit, an electrically erasable and programmable read-only memory (EEPROM) circuit, a phase-change random access memory (PRAM) circuit, a magnetic random access memory (MRAM) circuit, a resistive random access memory (RRAM) circuit, or a combination thereof. The logic circuit may include, for example, a central processing unit (CPU) circuit, a graphics processing unit (GPU) circuit, a controller circuit, an application specific integrated circuit (ASIC), an application processor (AP) circuit, or a combination thereof.

The chip pad 112 may connect an integrated circuit of the body 111 to the lower connection structure 130. The chip pad 112 may include, for example, a conductive material, such as Cu, Au, Ag, Ni, W, Al, or an alloy thereof.

The intermediate connection structure 120 is disposed between the lower connection structure 130 and the upper connection structure 150, and may be configured to connect between the lower connection structure 130 and the upper connection structure 150. The intermediate connection structure 120 may be disposed around the first semiconductor chip 110. In some embodiments, the intermediate connection structure 120 includes a hole 120H, and the first semiconductor chip 110 may be disposed in the hole 120H of the intermediate connection structure 120. In other words, the intermediate connection structure 120 may surround portions of the first semiconductor chip 110.

The intermediate connection structure 120 may include at least one intermediate via 123a and 123b configured to connect between the lower connection structure 130 and the upper connection structure 150. In some embodiments, the intermediate connection structure 120 may further include at least one intermediate insulating layer 121a and 121b penetrated by the at least one intermediate via 123a and 123b. In some embodiments, the intermediate connection structure 120 may further include a plurality of intermediate conductive pattern layers 122a, 122b, and 122c that are disposed on the at least one intermediate insulating layer 121a and 121b and connected to each other by the at least one intermediate via 123a and 123b. The at least one intermediate via 123a and 123b and the plurality of intermediate conductive pattern layers 122a, 122b, and 122c may provide an electrical path connecting between the lower connection structure 130 and the upper connection structure 150.

For example, the intermediate connection structure 120 may include: the first intermediate conductive pattern layer 122a on an upper surface of the lower connection structure 130; the first intermediate insulating layer 121a on an upper surface of the first intermediate conductive pattern layer 122a and on an upper surface of the lower connection structure 130; the first intermediate via 123a penetrating the first intermediate insulating layer 121a to be in contact with an upper surface of the first intermediate conductive pattern layer 122a; the second intermediate conductive pattern layer 122b on an upper surface of the first intermediate via 123a and on an upper surface of the first intermediate insulating layer 121a; the second intermediate insulating layer 121b on an upper surface of the second intermediate conductive pattern layer 122b and on the first intermediate insulating layer 121a; the second intermediate via 123b penetrating the second intermediate insulating layer 121b to be in contact with an upper surface of the second intermediate conductive pattern layer 122b; and the third intermediate conductive pattern layer 122c on an upper surface of the second intermediate via 123b and on an upper surface of the second intermediate insulating layer 121b. In some embodiments, unlike the illustration in FIG. 1, the intermediate connection structure 120 may include more or fewer than three conductive pattern layers. The first intermediate via 123a may connect between the first intermediate conductive pattern layer 122a and the second intermediate conductive pattern layer 122b, and the second intermediate via 123b may connect between the second intermediate conductive pattern layer 122b and the third intermediate conductive pattern layer 122c. The first intermediate conductive pattern layer 122a may be in contact with the first lower via 133a of the lower connection structure 130, and the third intermediate conductive pattern layer 122c may be in contact with the second upper via 153b of the upper connection structure 150.

The first and second intermediate insulating layers 121a and 121b may include an insulating material. Examples of the insulating material may include thermosetting resin such as epoxy resin, thermoplastic resin such as polyimide, or an insulating material, which is such resin impregnated in a core material such as inorganic filler and/or glass fiber such as glass cloth and glass fabric, and the like, such as prepreg, an ajinomoto build-up film (ABF), flame retardant 4 (FR-4), bismaleimide triazine (BT), and the like. The first, second, and third intermediate conductive pattern layers 122a, 122b, and 122c and the first and second intermediate vias 123a and 123b may include, for example, a conductive material, such as Cu, Au, Ag, Ni, W, Al, or an alloy thereof. In some embodiments, the first, second, and third intermediate conductive pattern layers 122a, 122b, and 122c and the first and second intermediate vias 123a and 123b may further include a barrier material for preventing the conductive material from diffusing out of the first, second, and third intermediate conductive pattern layers 122a, 122b, and 122c and the first and second intermediate vias 123a and 123b. The barrier material may include, for example, Ti, Ta, TiN, TaN, or a combination thereof.

The first sealing layer 140 may be on and/or cover an upper surface of the first semiconductor chip 110 and the upper surface of the intermediate connection structure 120. In addition, the first sealing layer 140 may be in and/or fill a space between the first semiconductor chip 110 and the upper connection structure 150 and a space between the intermediate connection structure 120 and the upper connection structure 150. In some embodiments, the first sealing layer 140 may at least partially further fill a space between the intermediate connection structure 120 and the first semiconductor chip 110 and a space between the lower connection structure 130 and the first semiconductor chip 110. The first sealing layer 140 may include, for example, thermosetting resin such as epoxy resin, thermoplastic resin such as polyimide, or resin containing inorganic filler, specifically such as an ABF, FR-4, BT, resin, and the like. Alternatively, the first sealing layer 140 may include a molding material such as epoxy molding compound (EMC) or a photo sensitive material such as a photoimageable dielectric (PID) material.

The upper connection structure 150 may be configured to be connected to the intermediate connection structure 120. The upper connection structure 150 may include: the first upper conductive pattern layer 152a on the first sealing layer 140 and on the first semiconductor chip 110; the first upper insulating layer 151a on the first upper conductive pattern layer 152a; the second upper conductive pattern layer 152b on the first upper insulating layer 151a; the first upper via 153a penetrating the first upper insulating layer 151a to extend between the first upper conductive pattern layer 152a and the second upper conductive pattern layer 152b; and the second upper insulating layer 151b extending between a side surface of the first upper via 153a and the first upper insulating layer 151a. In some embodiments, the upper connection structure 150 may further include the second upper via 153b penetrating the first upper insulating layer 151a to extend between the third intermediate conductive pattern layer 122c of the intermediate connection structure 120 and the second upper conductive pattern layer 152b. The upper connection structure 150 may include a redistribution structure.

At least a portion of the first upper conductive pattern layer 152a may be grounded, and at least a portion of the second upper conductive pattern layer 152b may be configured to transmit signals (e.g., signals that are not ground). In addition, the first upper conductive pattern layer 152a may be used for grounding, and the second upper conductive pattern layer 152b may be used for transmitting signals. Signal characteristics (e.g., signal integrity) and power characteristics (e.g., power integrity) of a signal transmitted through the second upper conductive pattern layer 152b may be improved by grounding at least a portion of the first upper conductive pattern layer 152a.

In some embodiments, portions of the first upper conductive pattern layer 152a may be electrically disconnected from other portions of the first upper conductive pattern layer 152a. In other words, not all portions of the first upper conductive pattern layer 152a may be electrically interconnected together. In some embodiments, portions of the first upper conductive pattern layer 152a may be formed of a same material at approximately the same time. In some embodiments, the portions of the first upper conductive pattern layer 152a may be disposed at approximately the same level within the semiconductor package 100. Similarly, portions of the second upper conductive pattern layer 152b may be electrically disconnected from other portions of the second upper conductive pattern layer 152b. In some embodiments, portions of the second upper conductive pattern layer 152b may be formed of a same material at approximately the same time. In some embodiments, the portions of the second upper conductive pattern layer 152b may be disposed at approximately the same level within the semiconductor package 100.

At least a portion of the first upper conductive pattern layer 152a may be grounded by the first upper via 153a and a portion of the second upper conductive pattern layer 152b. Only a portion of the second upper conductive pattern layer 152b may be grounded, and the remaining portions of the second upper conductive pattern layer 152b may be used for transmitting signals. In some embodiments, the first upper conductive pattern layer 152a may be entirely grounded. In other embodiments, only a portion of the first upper conductive pattern layer 152a may be used for transmitting signals, and the remaining portions of the first upper conductive pattern layer 152a may be grounded. By using a portion of the first upper conductive pattern layer 152a to transmit a signal, a pattern density of the second upper conductive pattern layer 152b may be reduced more than the case where only the second upper conductive pattern layer 152b is used to transmit a signal.

In some embodiments, the upper connection structure 150 may not include a via directly connecting between the first upper conductive pattern layer 152a and the intermediate connection structure 120. In other words, the upper connection structure 150 may not include a via penetrating the first sealing layer 140 to extend between the first upper conductive pattern layer 152a and the third intermediate conductive pattern layer 122c of the intermediate connection structure 120. In some embodiments, the first upper conductive pattern layer 152a may be indirectly connected to the intermediate connection structure 120 through the first upper via 153a, the second upper conductive pattern layer 152b, and the second upper via 153b. Because the upper connection structure 150 does not include a via on a lower surface of the first upper conductive pattern layer 152a, the first upper conductive pattern layer 152a does not need to be formed thick to fill the via when the first upper conductive pattern layer 152a and the via on a lower surface of the first upper conductive pattern layer 152a are manufactured at the same time. In other words, the first upper conductive pattern layer 152a may be formed relatively thinner than the second upper conductive pattern layer 152b formed at the same time as the first upper via 153a and the second upper via 153b. The thickness (ta) of the first upper conductive pattern layer 152a may be less than the thickness (tb) of the second upper conductive pattern layer 152b. Thus, the thickness of the semiconductor package 100 may be reduced.

The second upper insulating layer 151b may be disposed on the first upper insulating layer 151a and may be on and/or surround a side wall of the first upper via 153a. The second upper insulating layer 151b may further surround a side surface of the second upper via 153b. The second upper insulating layer 151b may further extend between a side surface of the second upper via 153b and the first upper insulating layer 151a and between a side surface of the second upper via 153b and the first sealing layer 140. In some embodiments, the second upper insulating layer 151b may further extend between the second upper conductive pattern layer 152b and the first upper insulating layer 151a. In other words, the second upper conductive pattern layer 152b may be disposed on the second upper insulating layer 151b. A thickness of the second upper insulating layer 151b may be about 1 μm to about 8 μm.

The first and second upper conductive pattern layers 152a and 152b and the first and second upper vias 153a and 153b may include, for example, a conductive material such as Cu, Au, Ag, Ni, W, Al, or an alloy thereof. In some embodiments, the first and second upper conductive pattern layers 152a and 152b and the first and second upper vias 153a and 153b may further include a barrier material for preventing the conductive material from diffusing out of the first and second upper conductive pattern layers 152a and 152b and the first and second upper vias 153a and 153b. The barrier material may include, for example, Ti, Ta, TiN, TaN, or a combination thereof. In some embodiments, the second upper conductive pattern layer 152b may further include a wetting material to increase wettability between the conductive material and another connection member (e.g., an inter-package connection member 300 (refer to FIG. 3)). When the conductive material includes Cu, the wetting material may include Ni, Au, or an alloy thereof.

A chemical composition of the first upper insulating layer 151a may differ from that of the second upper insulating layer 151b. Whereas the first upper insulating layer 151a may include a composite material including a matrix and a filler in the matrix, the second upper insulating layer 151b may not include the filler. The matrix may include polymer, and the filler may include silica, titania, or a combination thereof. The second upper insulating layer 151b may include an organic insulating material that does not include the filler such as polyimide, epoxy resin, or a combination thereof. Because the second upper insulating layer 151b does not include the filler, when the second upper conductive pattern layer 152b is formed on the second upper insulating layer 151b, using sputtering, contamination of manufacturing equipment, such as a sputtering chamber, by the filler, may be prevented.

The difference between the chemical composition of the first upper insulating layer 151a and the chemical composition of the second upper insulating layer 151b derives from the fact that the first upper insulating layer 151a and the second upper insulating layer 151b have been formed, using different materials for different purposes. The first upper insulating layer 151a may be formed of a material, for example a build-up film, such as an ABF, which may easily fill a gap between patterns in the first upper conductive pattern layer 152a and may easily form the first upper insulating layer 151a. On the other hand, the second upper insulating layer 151b may be formed, using a material with which a fine pattern is easily formed, such as a PID material. By forming the first upper insulating layer 151a and the second upper insulating layer 151b, using different materials, the gap between the patterns in the first upper conductive pattern layer 152a may be easily filled, and the first upper via 153a and the second upper conductive pattern layer 152b may be formed finer. As a result, the planar area of the upper connection structure 150 and of the semiconductor package 100 may be reduced.

The upper protective layer 160 may be on and/or cover the second upper insulating layer 151b and the second upper conductive pattern layer 152b, and only a portion of the second upper conductive pattern layer 152b may be exposed. The upper protective layer 160 may include, for example, solder resist.

The external connection terminal 170 may be disposed on a lower surface of the lower pad 135 of the lower connection structure 130. The external connection terminal 170 may include, for example, a conductive material, such as tin (Sn), lead (Pb), Ag, Cu, or an alloy thereof. The external connection terminal 170 may be formed, in some embodiments, using a solder ball. The external connection terminal 170 may connect the semiconductor package 100 to a circuit board, another semiconductor package, an interposer, or a combination thereof. The capacitor 180 may stabilize power. The capacitor 180 may be connected to the lower connection structure 130 through the lower pad 135 of the lower connection structure 130.

Figure 2:
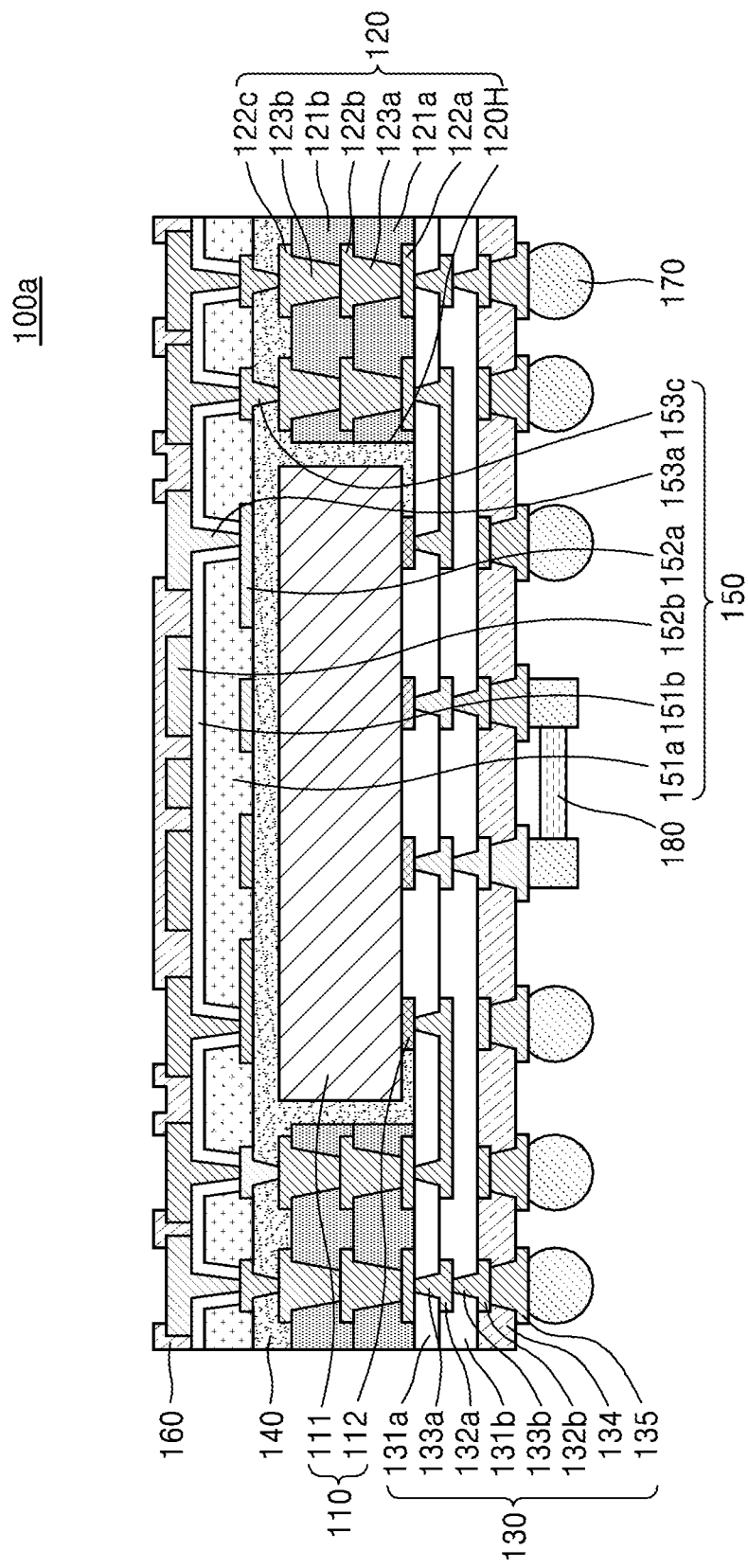
FIG. 2 is a cross-sectional view illustrating a semiconductor package according to another embodiment of the present disclosure.

FIG. 2 is a cross-sectional view illustrating a semiconductor package 100a according to an embodiment of the present disclosure. Hereinafter, the difference between the semiconductor package 100 illustrated in FIG. 1 and the semiconductor package 100a illustrated in FIG. 2 will be described.

Referring to FIG. 2, the upper connection structure 150 may further include a third upper via 153c directly connecting between the first upper conductive pattern layer 152a and the third intermediate conductive pattern layer 122c of the intermediate connection structure 120. The third upper via 153c may penetrate the first sealing layer 140 to extend between the first upper conductive pattern layer 152a and the third intermediate conductive pattern layer 122c of the intermediate connection structure 120. The second upper insulating layer 151b may not be in contact with the side surface of the third upper via 153c. The second upper conductive pattern layer 152b may be connected to the third intermediate conductive pattern layer 122c of the intermediate connection structure 120 through the first upper via 153a, the first upper conductive pattern layer 152a, and the third upper via 153c.

Figure 3:
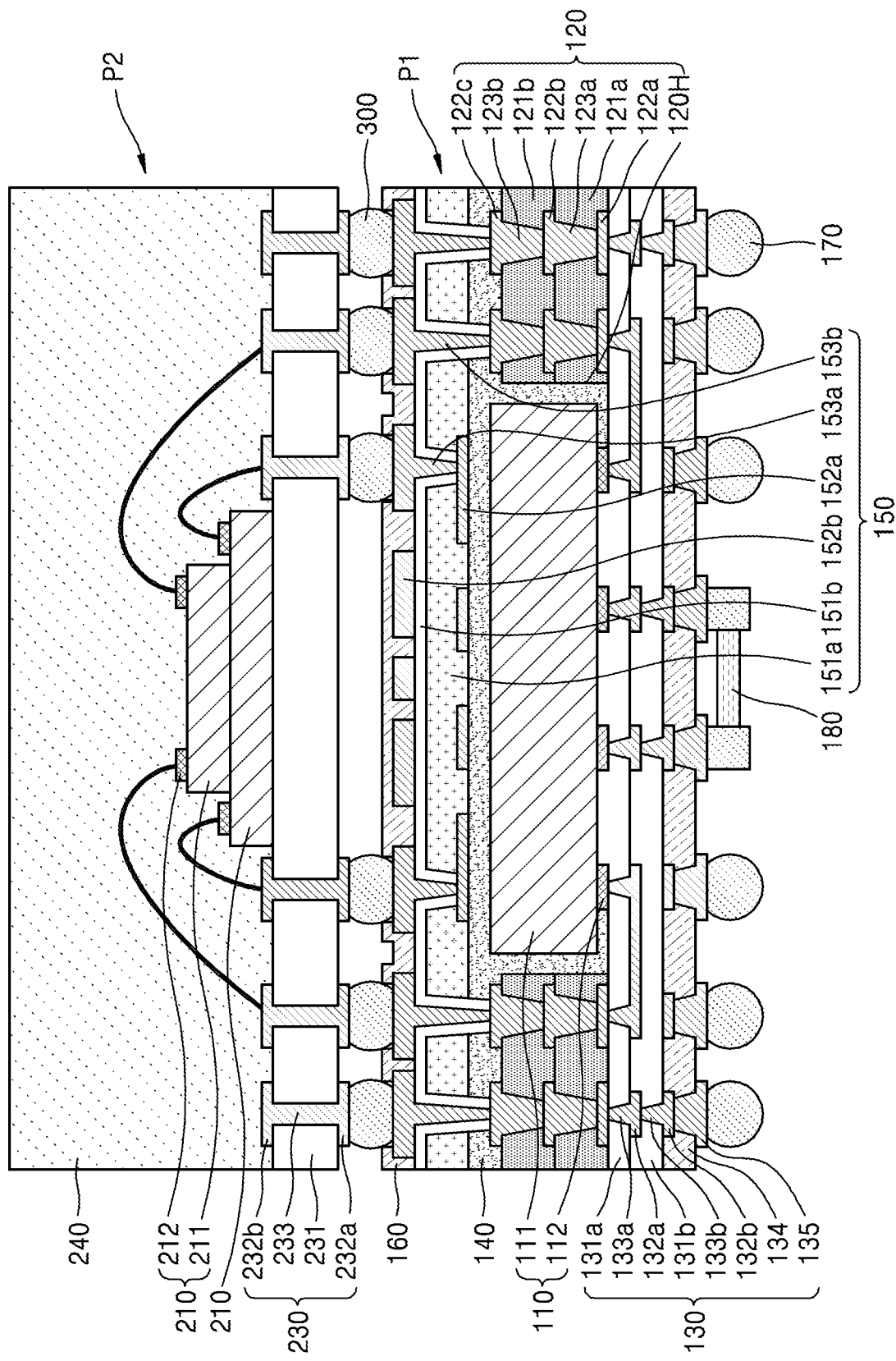
FIG. 3 is a cross-sectional view illustrating a semiconductor package according to another embodiment of the present disclosure.

FIG. 3 is a cross-sectional view illustrating a semiconductor package 1000 according to an embodiment of the present disclosure.

Referring to FIG. 3, the semiconductor package 1000 may include a lower semiconductor package P1, an upper semiconductor package P2 on the lower semiconductor package P1, and an inter-package connection member 300 between the lower semiconductor package P1 and the upper semiconductor package P2. The semiconductor package 1000 may be a package on package (POP) type. The lower semiconductor package P1 may be the semiconductor package 100 illustrated in FIG. 1 or the semiconductor package 100a illustrated in FIG. 2.

The upper semiconductor package P2 may include a connection structure 230 and a second semiconductor chip 210 on the connection structure 230. In some embodiments, the upper semiconductor package P2 may include a plurality of second semiconductor chips 210 stacked on the connection structure 230. In some embodiments, the upper semiconductor package P2 may further include a second sealing layer 240 covering the connection structure 230 and the second semiconductor chip 210.

The connection structure 230 may include, for example: an insulating layer 231; an upper conductive pattern layer 232b on the upper surface of the insulating layer 231; a lower conductive pattern layer 232a on the lower surface of the insulating layer 231; and a via 233 penetrating the insulating layer 231 to extend between the upper conductive pattern layer 232b and the lower conductive pattern layer 232a, thus connecting between the upper conductive pattern layer 232b and the lower conductive pattern layer 232a. The connection structure 230 may include a PCB or a redistribution structure. The insulating layer 231 may include, for example FR4, tetrafunctional epoxy, polyphenylene ether, epoxy/polyphenylene oxide, BT, thermount, cyanate ester, polyimide, or a combination thereof. The upper conductive pattern layer 232b, the lower conductive pattern layer 232a, and the via 233 may include, for example, a conductive material such as Cu, Au, Ag, Ni, W, Al, or an alloy thereof.

The second semiconductor chip 210 may include a body 211 and a chip pad 212 on an upper surface of the body 211.

The body 211 may include a substrate and an integrated circuit, and the integrated circuit may be disposed on an upper surface of the second semiconductor chip 210. An active surface of the second semiconductor chip 210 may be an upper surface of the second semiconductor chip 210. The second semiconductor chip 210 may be connected to the upper conductive pattern layer 232b of the connection structure 230 through a wire. In other embodiments, the chip pad 212 of the second semiconductor chip 210 may be disposed on a lower surface of the second semiconductor chip 210, and the integrated circuit of the body 211 of the second semiconductor chip 210 may be disposed on a lower surface of the second semiconductor chip 210. An active surface of the second semiconductor chip 210 may be a lower surface of the second semiconductor chip 210. The second semiconductor chip 210 may be connected to the upper conductive pattern layer 232b of the connection structure 230 through a bump or a pillar.

In some embodiments, the integrated circuit of the body 111 of the first semiconductor chip 110 of the lower semiconductor package P1 includes a logic circuit, and the integrated circuit of the body 211 of the second semiconductor chip 210 of the upper semiconductor package P2 may include a memory circuit. The second sealing layer 240 may include, for example, epoxy resin, silicone resin, or a combination thereof. The second sealing layer 240 may include, for example an epoxy mold compound.

The inter-package connection member 300 may be disposed between the lower conductive pattern layer 232a of the connection structure 230 of the upper semiconductor package P2 and the second upper conductive pattern layer 152b of the upper connection structure 150 of the lower semiconductor package P1, and the inter-package connection member 300 may connect between the lower conductive pattern layer 232a of the connection structure 230 of the upper semiconductor package P2 and the second upper conductive pattern layer 152b of the upper connection structure 150 of the lower semiconductor package P1. The upper protective layer 160 of the lower semiconductor package P1 may expose a portion of the second upper conductive pattern layer 152b being in contact with the inter-package connection member 300 and cover the remaining portions of the second upper conductive pattern layer 152b. The inter-package connection member 300 may include, for example a conductive material, such as Sn, Ph, Ag, Cu, or an alloy thereof. The inter-package connection member 300 may be formed from a solder ball.

FIGS. 4A to 4H are cross-sectional views illustrating a method of manufacturing the semiconductor package 100 (refer to FIG. 1) according to an embodiment of the present disclosure.

Figure 4A:
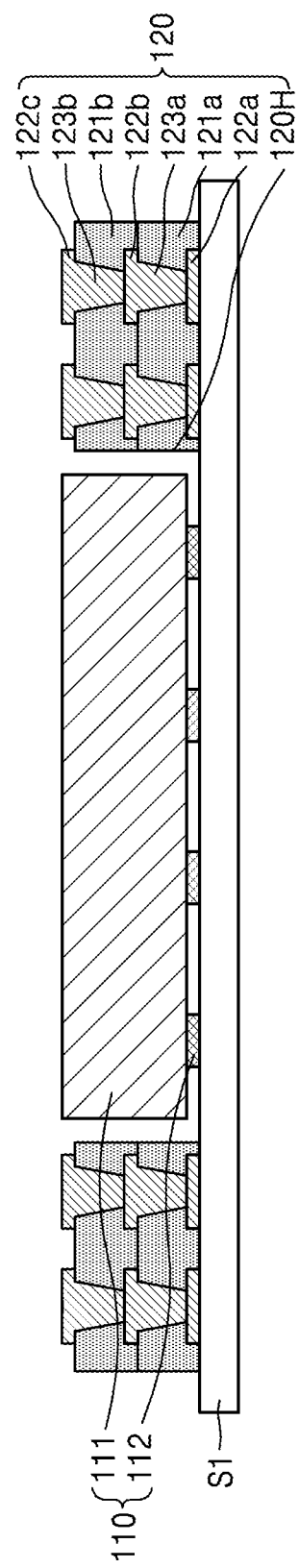
FIGS. 4A to 4H are across-sectional views illustrating a method of manufacturing a semiconductor package according to an embodiment of the present disclosure.

Referring to FIG. 4A, the hole 120H penetrating the intermediate connection structure 120 may be formed in the intermediate connection structure 120. The hole 120H of the intermediate connection structure 120 may be formed, for example, by mechanical drilling, laser drilling, sand blasting, dry etching, and/or wet etching. Following that, a first support structure S1 may be attached onto a lower surface of the intermediate connection structure 120. The first support structure S1 may include, for example, any material capable of fixing the support structure S1, such as an adhesive film. Examples of the adhesive film may include a heat curable adhesive film having adhesive force that is weakened by heat treatment or an ultraviolet curable adhesive film having adhesive force that is weakened by ultraviolet irradiation. Following that, the first semiconductor chip 110 may be attached to the first support structure S1 by arranging the first semiconductor chip 110 in the hole 120H of the intermediate connection structure 120 such that the chip pad 112 of the first semiconductor chip 110 faces the first support structure S1.

Figure 4B:
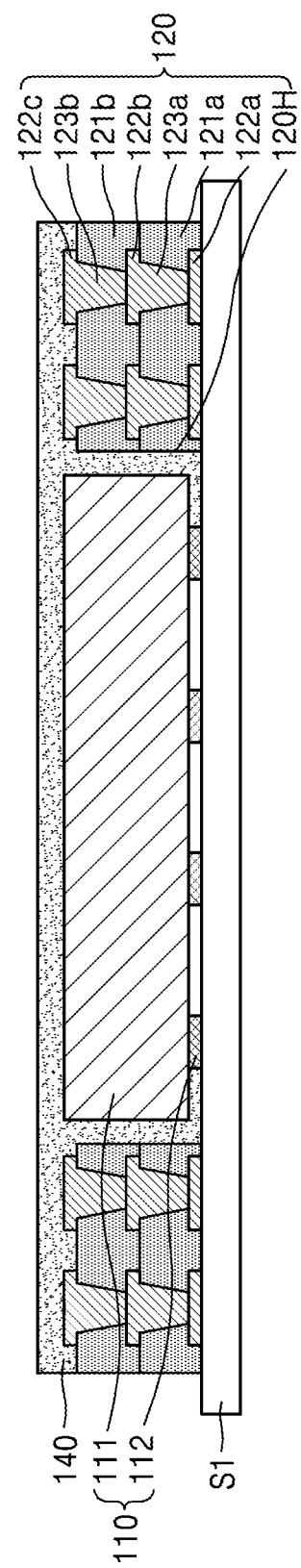

Referring to FIG. 4B, the first sealing layer 140 on and/or covering the first semiconductor chip 110 and the intermediate connection structure 120 may be formed. The first sealing layer 140 may be formed by a known method. For example, the first sealing layer 140 may be formed by laminating a sealing material on an upper surface of the first semiconductor chip 110 and on an upper surface of the intermediate connection structure 120 and then curing the sealing material. In some embodiments, the first sealing layer 140 may be formed by applying a liquid sealing material on the first support structure S1, the first semiconductor chip 110, and the intermediate connection structure 120 and curing the liquid sealing material.

Figure 4C:
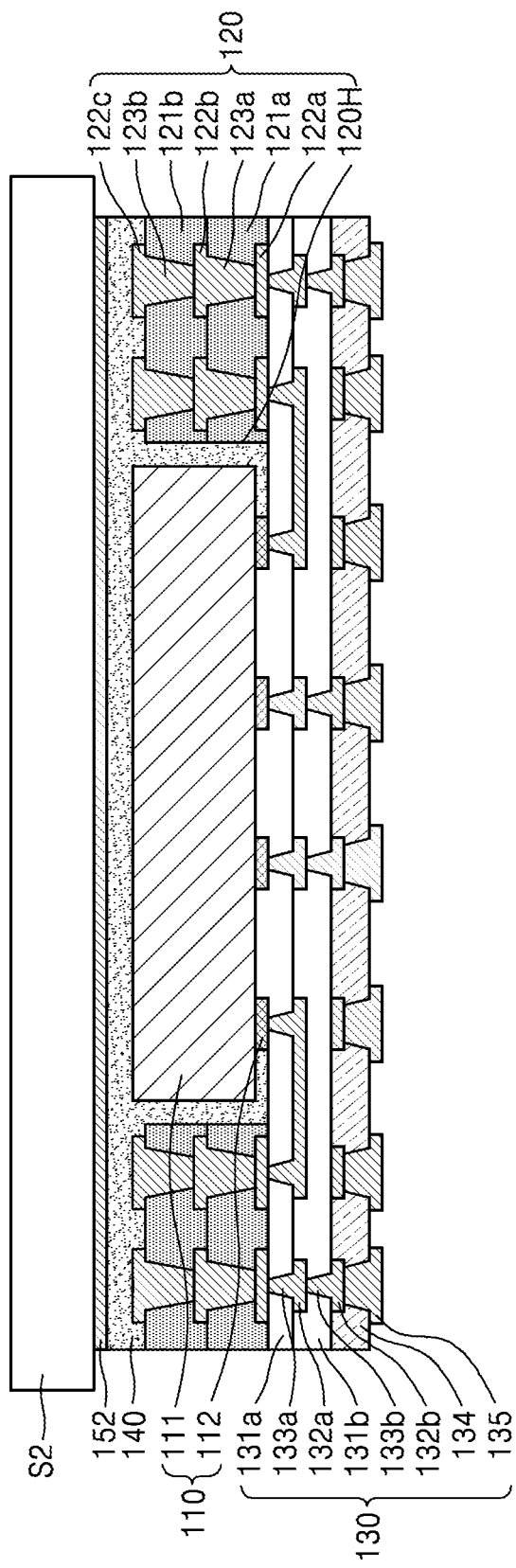

Referring to FIGS. 4B and 4C, the first support structure S1 may be removed. More specifically, the first support structure S1 may be removed by using heat and/or ultraviolet rays to weaken adhesive force of the first support structure S1.

Referring to FIG. 4C, an upper conductive layer 152 may attach a second support structure S2, on which the upper conductive layer 152 is formed, onto the first sealing layer 140 such that the upper conductive layer 152 faces the first sealing layer 140 (e.g., the upper conductive layer 152 may be between the first sealing layer 140 and the second support structure S2). Next, the lower connection structure 130 may be formed on a lower surface of the intermediate connection structure 120 and on a lower surface of the first semiconductor chip 110. For example, the first lower insulating layer 131a may be formed on a lower surface of the intermediate connection structure 120 and on a lower surface of the first semiconductor chip 110, the first lower via 133a and the first lower conductive pattern layer 132a may be formed on the first lower insulating layer 131a, the second lower insulating layer 131b may be formed on the first lower insulating layer 131a and the first lower conductive pattern layer 132a, the second lower via 133b and the second lower conductive pattern layer 132b may be formed on the second lower insulating layer 131b, the lower protective layer 134 may be formed on the second lower conductive pattern layer 132b and the second lower insulating layer 131b, and the lower pad 135 may be formed on the lower protective layer 134.

Unlike the description given with reference to FIGS. 4A to 4C, in other embodiments, the lower connection structure 130 may be formed on a support structure (not shown) first, then the intermediate connection structure 120 and the first semiconductor chip 110 may be attached onto the lower connection structure 130, and finally the first sealing layer 140 may be formed.

Figure 4D:
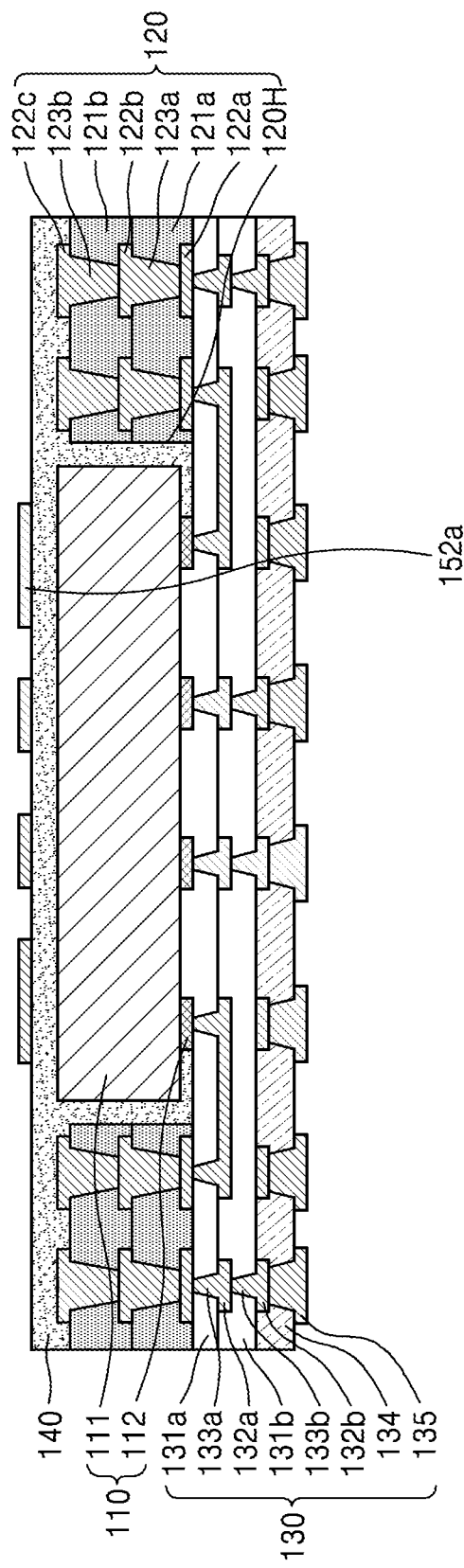

Referring to FIGS. 4C and 4D, the second support structure S2 may be removed, leaving the upper conductive layer 152 on the first sealing layer 140. Following that, the first upper conductive pattern layer 152a may be formed by patterning the upper conductive layer 152 through etching. Because a via penetrating the first sealing layer 140 to be in contact with the lower surface of the first upper conductive pattern layer 152a does not need to be formed together with the first upper conductive pattern layer 152a, the first upper conductive pattern layer 152a does not need to be formed thick to fill the via in contact with a lower surface of the first upper conductive pattern layer 152a. Accordingly, the first upper conductive pattern layer 152a may be formed thin, and the semiconductor package 100 (refer to FIG. 1) may be formed thin. Unlike the description given with reference to FIGS. 4C and 4D, in other embodiments, the upper conductive layer 152 may not be formed on the second support structure S2, a mask pattern (not shown) may be formed on the first sealing layer 140, and the first upper conductive pattern layer 152a may be formed, using the mask pattern.

Figure 4E:
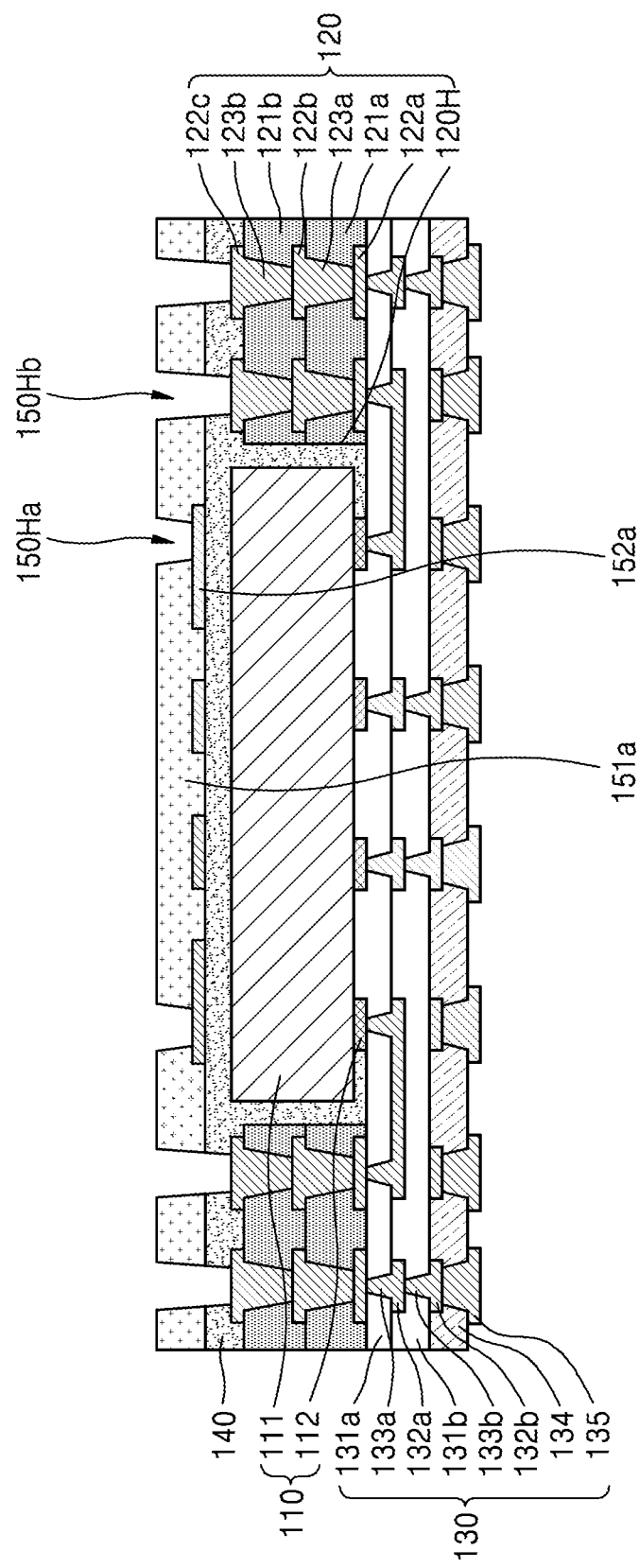

Referring to FIG. 4E, the first upper insulating layer 151a may be formed on the first sealing layer 140 and the first upper conductive pattern layer 152a. For example, the first upper insulating layer 151a may be formed by attaching a build-up film such as an ABF onto the first sealing layer 140 and the first upper conductive pattern layer 152a. The first upper insulating layer 151a may easily fill the gap between the patterns in the first upper conductive pattern layer 152a, and the first upper insulating layer 151a may be easily formed by using the build-up film. Following that, a first hole 150Ha penetrating the first upper insulating layer 151a to expose a portion of the first upper conductive pattern layer 152a and a second hole 150Hb penetrating the first upper insulating layer 151a and the first sealing layer 140 to expose a portion of the third intermediate conductive pattern layer 122c of the intermediate connection structure 120 may be formed. The first hole 150Ha and the second hole 150Hb may be formed using, for example, a laser.

Figure 4F:
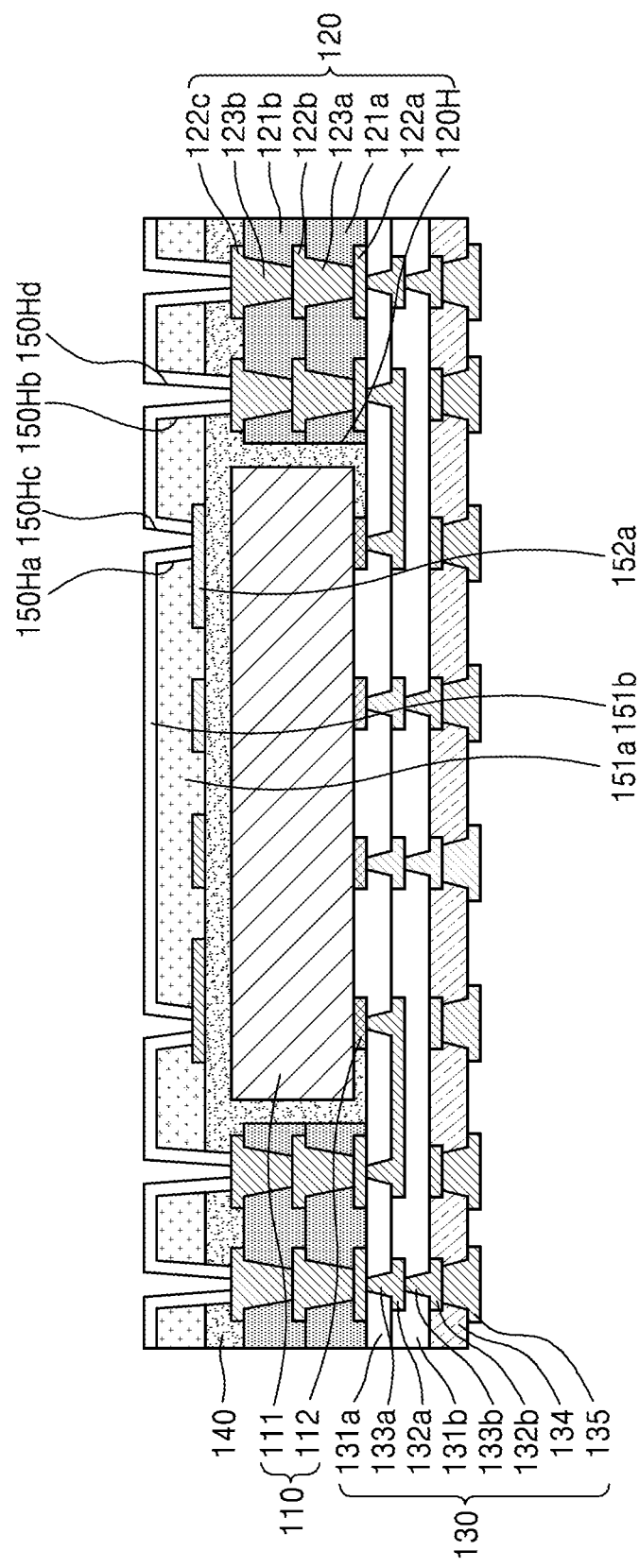

Referring to FIG. 4F, the second upper insulating layer 151b may be formed on the first upper insulating layer 151a, a side surface of the first hole 150Ha, and a side surface of the second hole 150Hb. A third hole 150Hc in the first hole 150Ha exposing a portion of the first upper conductive pattern layer 152a and a fourth hole 150Hd in the second hole 150Hb exposing a portion of the third intermediate conductive pattern layer 122c of the intermediate connection structure 120 may be formed, for example, by coating the upper surface of the first upper insulating layer 151a and the inside of the first hole 150Ha and of the second hole 150Hb with a liquid photosensitive insulating material and selectively exposing the liquid photosensitive insulating material. A diameter of the third hole 150Hc may be less than a diameter of the first hole 150Ha, and a diameter of the fourth hole 150Hd may be less than a diameter of the second hole 150Hb. The third hole 150Hc and the fourth hole 150Hd having a fine, namely, small diameter may be formed by using a photosensitive insulating material to form the second upper insulating layer 151b.

Figure 4G:
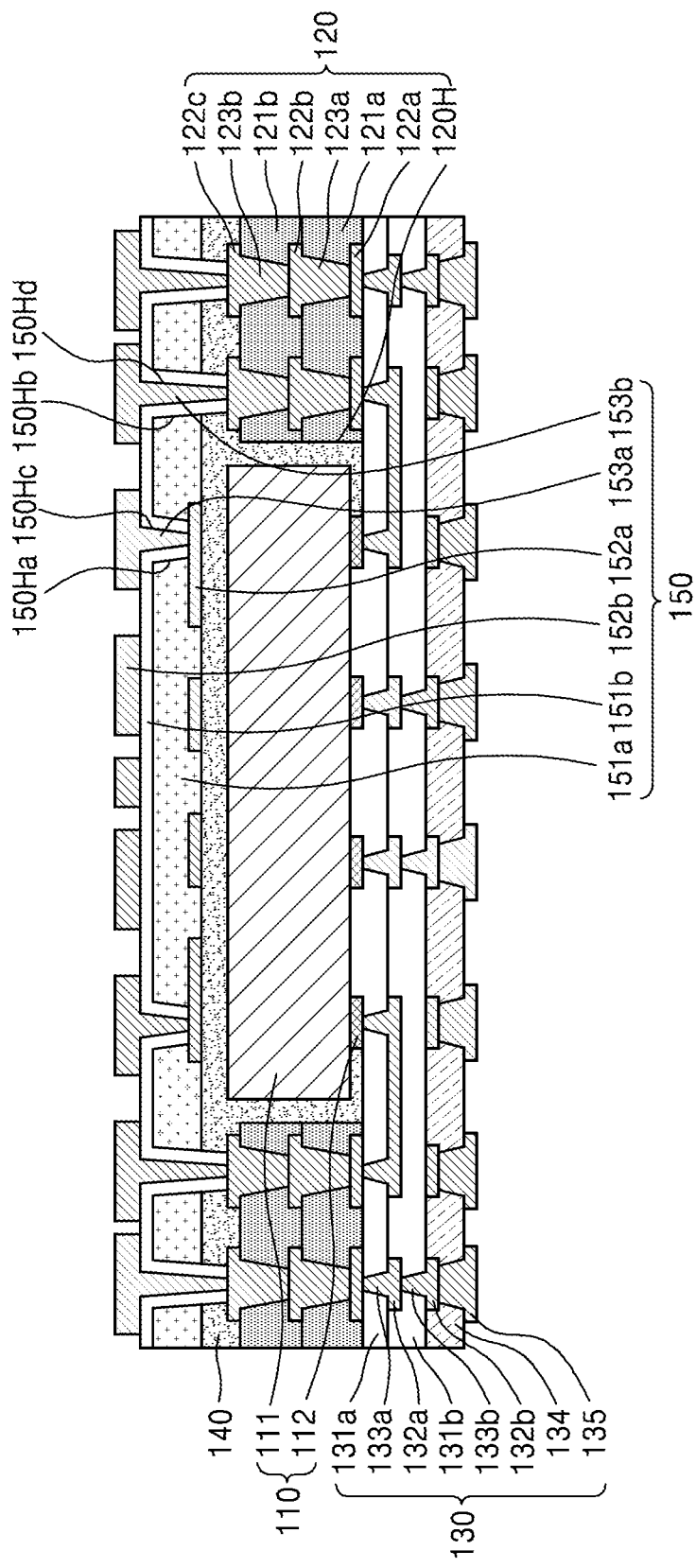

Referring to FIG. 4G, the first upper via 153a in and/or filling the third hole 150Hc, the second upper via 153b in and/or filling the fourth hole 150Hd, and the second upper conductive pattern layer 152b on the second upper insulating layer 151b may be formed. More specifically, the first upper via 153a, the second upper via 153b, and the second upper conductive pattern layer 152b may be formed by forming a mask pattern (not shown) on the second upper insulating layer 151b, forming a seed layer on the second upper insulating layer 151b, the third hole 150Hc, and the fourth hole 150Hd by using sputtering, forming a filling layer on the seed layer by using plating, and removing the mask pattern. In some embodiments, the forming of the first upper via 153a, the second upper via 153b, and the second upper conductive pattern layer 152b may further include forming a wetting layer on the filling layer using, for example, plating. When the first upper via 153a, the second upper via 153b, and the second upper conductive pattern layer 152b are formed, for example during sputtering, if the second upper insulating layer 151b does not include a filler, manufacturing equipment (e.g., a sputtering chamber) may not be contaminated by the filler. As a result, the upper connection structure 150 may be completed.

Figure 4H:
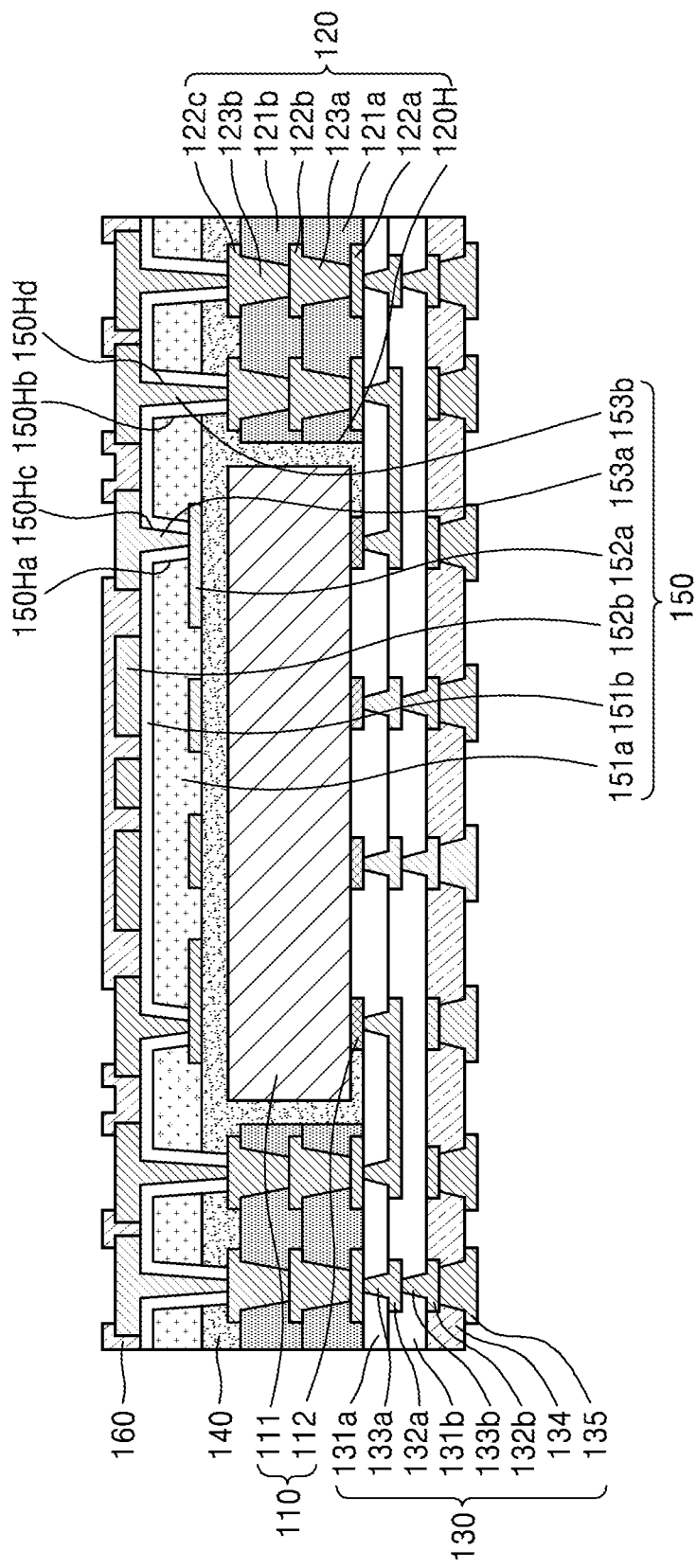

Referring to FIG. 4H, the upper protective layer 160 on and/or covering the second upper insulating layer 151b and the second upper conductive pattern layer 152b and exposing only a portion of the second upper conductive pattern layer 152b may be formed.

Referring to FIG. 1, the external connection terminal 170 and the capacitor 180 may be attached onto the lower pad 135 of the lower connection structure 130. For example, the external connection terminal 170 attached onto the lower pad 135 of the lower connection structure 130 may be formed by reflowing a solder ball. As a result, the semiconductor package 100 illustrated in FIG. 1 may be completely formed.

FIGS. 5A to 5D are cross-sectional views illustrating a method of manufacturing a semiconductor package 100a (refer to FIG. 2) according to an embodiment of the present disclosure.

Figure 5A:
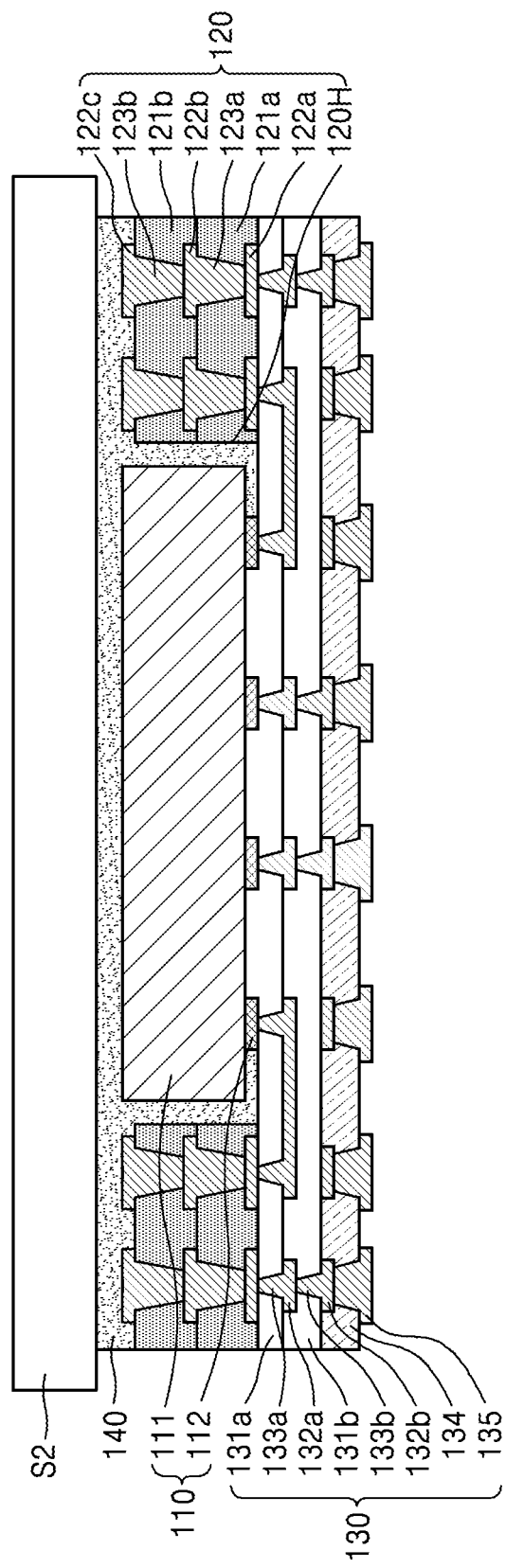
FIGS. 5A to 5D are across-sectional views illustrating a method of manufacturing a semiconductor package according to another embodiment of the present disclosure.

Referring to FIG. 5A, as described with reference to FIG. 4A, the first semiconductor chip 110 and the intermediate connection structure 120 may be attached onto the first support structure S1, as described with reference to FIG. 4B, the first sealing layer 140 may be formed and the first support structure S1 may be removed, and as illustrated in FIG. 5A, the second support structure S2 may be attached onto the first sealing layer 140, and the lower connection structure 130 may be formed on the intermediate connection structure 120 and the first semiconductor chip 110.

Figure 5B:
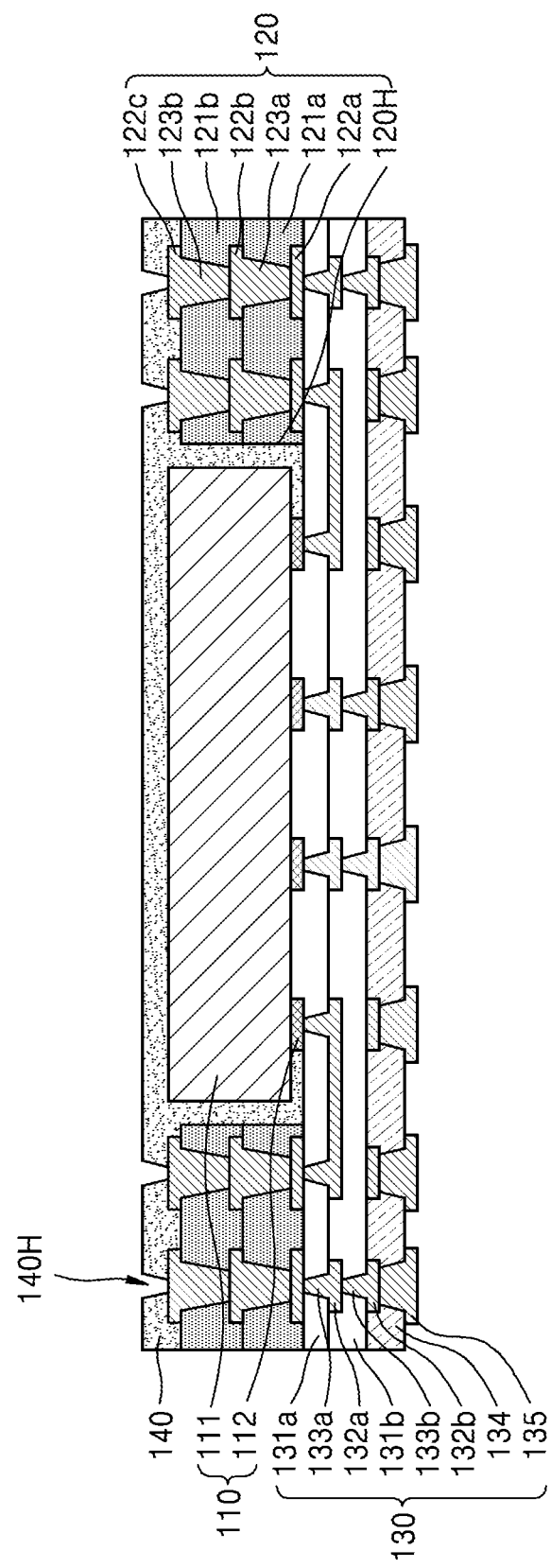

Referring to FIGS. 5A and 5B, the second support structure S2 may be removed. Following that, a fifth hole 140H penetrating the first sealing layer 140 to expose a portion of the third intermediate conductive pattern layer 122c of the intermediate connection structure 120 may be formed.

Figure 5C:
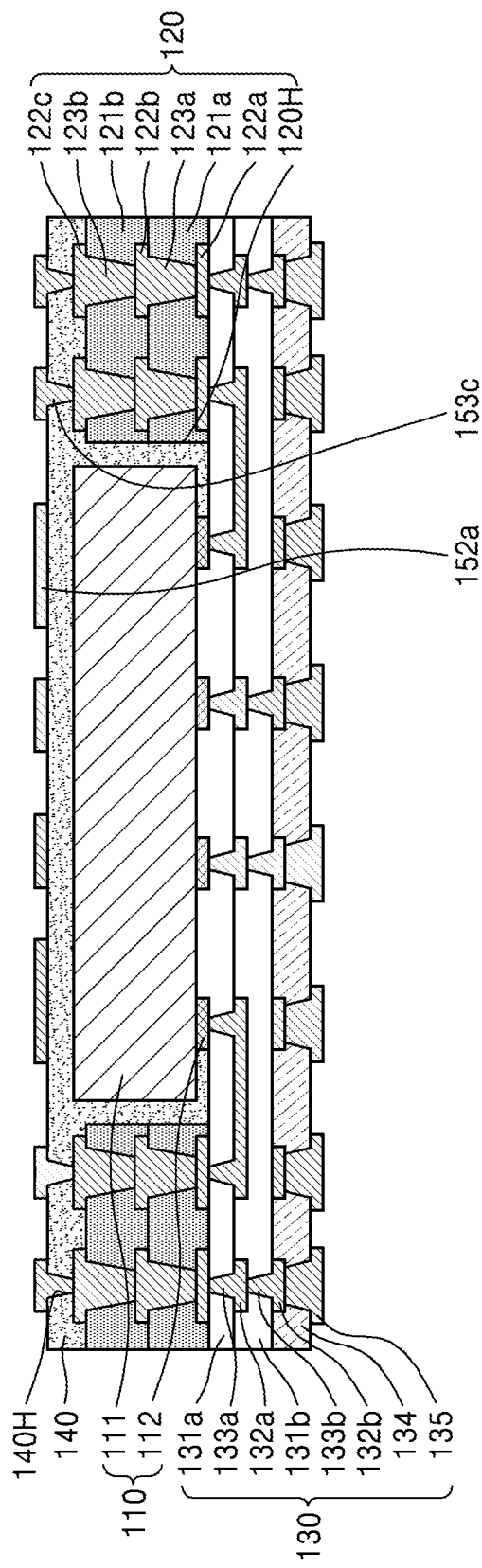

Referring to FIG. 5C, the first upper conductive pattern layer 152a on the first sealing layer 140 and the third upper via 153c filling and the fifth hole 140H may be formed. More specifically, the first upper conductive pattern layer 152a and the third upper via 153c may be formed by forming a mask pattern (not shown) on the first sealing layer 140, forming a seed layer on the first sealing layer 140 and the fifth hole 140H by using sputtering, forming a filling layer on the seed layer by plating, and removing the mask pattern.

Figure 5D:
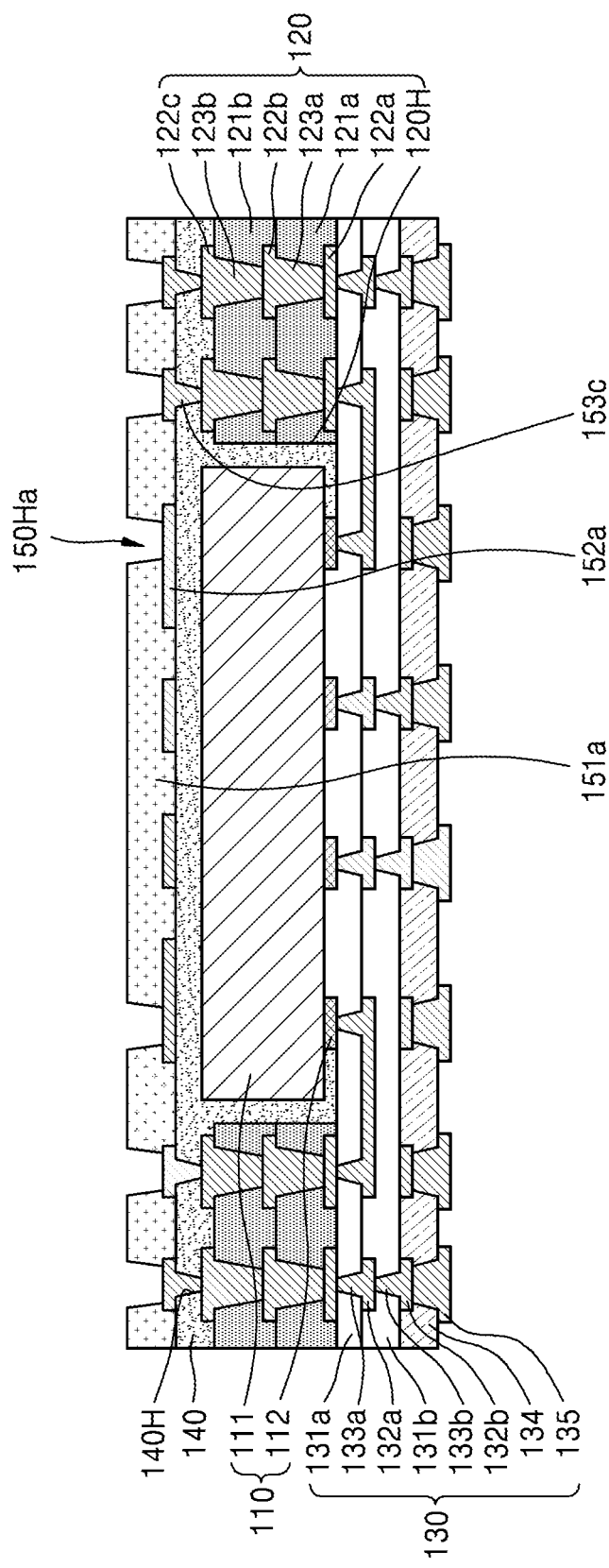

Referring to FIG. 5D, the first upper insulating layer 151a may be formed on the first sealing layer 140 and the first upper conductive pattern layer 152a. Following that, the first hole 150Ha penetrating the first upper insulating layer 151a to expose a portion of the first upper conductive pattern layer 152a may be formed.

As described with reference to FIG. 4F, the second upper insulating layer 151b and the third hole 150Hc may be formed, as described with reference to FIG. 4G, the first upper via 153a in the third hole 150Hc and the second upper conductive pattern layer 152b on the second upper insulating layer 151b may be formed, as described with reference to FIG. 4H, the upper protective layer 160 may be formed on the second upper conductive pattern layer 152b and the second upper insulating layer 151b, and as described with reference to FIG. 1, the external connection terminal 170 and the capacitor 180 may be attached onto the lower connection structure 130. As a consequence, the semiconductor package 100a illustrated in FIG. 2 may be completely formed.

Referring to FIG. 3, the upper semiconductor package P2 may be manufactured by attaching the second semiconductor chip 210 onto the connection structure 230 and forming the second sealing layer 240 covering the connection structure 230 and the second semiconductor chip 210. In addition, the lower semiconductor package P1 may be manufactured according to the method described with reference to FIGS. 4A to 4H or the method described with reference to FIGS. 5A to 5D. The inter-package connection member 300 may be attached between the lower conductive pattern layer 232a of the connection structure 230 of the upper semiconductor package P2 and the second upper conductive pattern layer 152b of the upper connection structure 150 of the lower semiconductor package P1. The inter-package connection member 300 may be formed by reflowing a solder ball. As a consequence, the semiconductor package 1000 illustrated in FIG. 3 may be completely formed.

While the inventive concepts have been particularly shown and described with reference to embodiments thereof, it will be understood that various changes in form and details may be made therein without departing from the scope of the following claims.

What is claimed is:

1. A semiconductor package comprising:
a semiconductor chip;
an intermediate connection structure comprising an intermediate insulating layer on sides of the semiconductor chip and an intermediate via penetrating the intermediate insulating layer;
a lower connection structure comprising a lower insulating layer on a lower surface of the semiconductor chip and on a lower surface of the intermediate connection structure and a lower conductive pattern layer on the lower insulating layer and connected to the semiconductor chip and the intermediate via;
an upper connection structure including a first upper conductive pattern layer on the semiconductor chip, a first upper insulating layer on the first upper conductive pattern layer, a second upper insulating layer on the first upper insulating layer, a second upper conductive pattern layer on the second upper insulating layer, a first upper via penetrating the first upper insulating layer and the second upper insulating layer to connect between the second upper conductive pattern layer and the first upper conductive pattern layer and a second upper via penetrating the first upper insulating layer and the second upper insulating layer to connect between the second upper conductive pattern layer and the intermediate via; and
an external connection terminal on a lower surface of the lower connection structure and connected to the lower conductive pattern layer,
wherein a portion of the first upper conductive pattern layer is configured to be grounded,
wherein a portion of the second upper conductive pattern layer is configured to transmit signals, and
wherein an entirety of the first conductive pattern layer is configured to be grounded.

2. The semiconductor package of claim 1, further comprising a sealing layer between an upper surface of the semiconductor chip and the first upper conductive pattern layer.

3. The semiconductor package of claim 1, wherein the second upper insulating layer further extends between the second upper conductive pattern layer and the first upper insulating layer.

4. The semiconductor package of claim 1, wherein the portion of the first upper conductive pattern layer that is configured to be grounded is a first portion, and
wherein the first upper conductive pattern layer further comprises a second portion that is configured to transmit signals.

5. The semiconductor package of claim 1, wherein the portion of the second upper conductive pattern layer that is configured to transmit signals is a first portion,
wherein the second upper conductive pattern layer further comprises a second portion that is configured to be grounded, and
wherein the portion of the first upper conductive pattern layer is configured to be grounded through the first via and the second portion of the second upper conductive pattern layer.

6. The semiconductor package of claim 1, wherein the first upper conductive pattern layer is indirectly electrically connected to the intermediate connection structure by the second upper conductive pattern layer.

7. A semiconductor package comprising:
a semiconductor chip;
an intermediate connection structure comprising an intermediate insulating layer on sides of the semiconductor chip and an intermediate via penetrating the intermediate insulating layer;
a lower connection structure comprising a lower insulating layer on a lower surface of the semiconductor chip and on a lower surface of the intermediate connection structure and a lower conductive pattern layer on the lower insulating layer and connected to the semiconductor chip and the intermediate via;
an upper connection structure including a first upper conductive pattern layer on the semiconductor chip, a first upper insulating layer on the first upper conductive pattern layer, a second upper insulating layer on the first upper insulating layer, a second upper conductive pattern layer on the second upper insulating layer, a first upper via penetrating the first upper insulating layer and the second upper insulating layer to connect between the second upper conductive pattern layer and the first upper conductive pattern layer, wherein a chemical composition of the first upper insulating layer differs from a chemical composition of the second upper insulating layer; and
an external connection terminal on a lower surface of the lower connection structure and connected to the lower conductive pattern layer,
wherein the first upper insulating layer comprises a composite material including a matrix and a filler in the matrix, the filler including silica, and
wherein the second upper insulating layer does not comprise the filler.

8. The semiconductor package of claim 7, further comprising a sealing layer between an upper surface of the semiconductor chip and the first upper conductive pattern layer.

9. The semiconductor package of claim 7, wherein the upper connection structure further comprises a second upper via penetrating the first upper insulating layer and the second upper insulating layer to connect between the second upper conductive pattern layer and the intermediate via.

10. The semiconductor package of claim 7, wherein the second upper insulating layer further extends between the second upper conductive pattern layer and the first upper insulating layer.

11. The semiconductor package of claim 7, wherein a portion of the first upper conductive pattern layer is configured to be grounded, and
wherein a portion of the second upper conductive pattern layer is configured to transmit signals.

12. A semiconductor package comprising:
a semiconductor chip;

an intermediate connection structure comprising an intermediate insulating layer on sides of the semiconductor chip and an intermediate via penetrating the intermediate insulating layer;

a lower connection structure comprising a lower insulating layer on a lower surface of the semiconductor chip and on a lower surface of the intermediate connection structure and a lower conductive pattern layer on the lower insulating layer and connected to the semiconductor chip and the intermediate via;

an upper connection structure including a first upper conductive pattern layer on the semiconductor chip, a first upper insulating layer on the first upper conductive pattern layer, a second upper insulating layer on the first upper insulating layer, a second upper conductive pattern layer on the second upper insulating layer, a first upper via penetrating the first upper insulating layer and the second upper insulating layer to connect between the second upper conductive pattern layer and the first upper conductive pattern layer, wherein a thickness of the first upper conductive pattern layer is less than a thickness of the second upper conductive pattern layer; and an external connection terminal on a lower surface of the lower connection structure and connected to the lower conductive pattern layer, wherein the first upper insulating layer comprises a composite material including a matrix and a filler in the matrix, the filler including silica, and wherein the second upper insulating layer does not comprise the filler.

13. The semiconductor package of claim 12, further comprising a sealing layer between an upper surface of the semiconductor chip and the first upper conductive pattern layer.

14. The semiconductor package of claim 12, wherein the upper connection structure further comprises a second upper via penetrating the first upper insulating layer and the second upper insulating layer to connect between the second upper conductive pattern layer and the intermediate via.

* * * * *